(12) United States Patent
Luttikhuis et al.

(10) Patent No.: US 7,352,438 B2
(45) Date of Patent: Apr. 1, 2008

(54) LITHOGRAPHIC APPARATUS AND DEVICE MANUFACTURING METHOD

(75) Inventors: Bernardus Antonius Johannes Luttikhuis, Nuenen (NL); Erik Roelof Loopsta, Heeze (NL); Harmen Klaas Van Der Schoot, Vught (NL); Fransicus Mathijs Jacobs, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 61 days.

(21) Appl. No.: 11/353,232

(22) Filed: Feb. 14, 2006

(65) Prior Publication Data

US 2007/0188723 A1    Aug. 16, 2007

(51) Int. Cl.
*G03B 27/42* (2006.01)
*G03B 27/58* (2006.01)

(52) U.S. Cl. ............................. 355/53; 355/72; 355/75; 378/34; 378/35

(58) Field of Classification Search .................. 355/72, 355/77, 53, 75
See application file for complete search history.

(56) References Cited

U.S. PATENT DOCUMENTS

| | | | |
|---|---|---|---|
| 6,549,271 B2 * | 4/2003 | Yasuda et al. | 355/55 |
| 7,153,612 B2 * | 12/2006 | Heerens et al. | 430/5 |
| 2006/0038973 A1 * | 2/2006 | Galburt | 355/75 |

* cited by examiner

*Primary Examiner*—D. Rutledge
(74) *Attorney, Agent, or Firm*—Pillsbury Winthrop Shaw Pittman LLP

(57) ABSTRACT

The mask in a lithographic apparatus is clamped on a first side using a first clamping device and on a second side, different from the first side, using a second clamping device. The clamping forces are preferably applied using thin membranes. The first clamp clamps the substrate in directions parallel to the plane of the patterning device, perpendicular to the plane of the patterning device and rotationally. The second clamping device clamps the patterning device only in directions parallel to the plane of the substrate.

19 Claims, 2 Drawing Sheets

US 7,352,438 B2

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The patterning device is conventionally clamped to a patterning device holder on the patterned side of the patterning device. This allows different patterning devices to be easily inserted and removed, thus improving the versatility of the lithographic apparatus. However, when large accelerations (up to 600 m/s$^2$) are applied to the patterning device it may slip, causing errors in the projection of (overlaying) patterns. To prevent the patterning device from slipping larger clamping forces may be applied. However, the application of a larger clamping force may cause deformation of the patterning device.

SUMMARY

It is desirable to clamp the patterning device to the lithographic apparatus without deforming the patterning device.

According to an embodiment of the invention, there is provided a lithographic apparatus including a support constructed to support a patterning device, the patterning device being capable of imparting the radiation beam with a pattern in its cross-section to form a patterned radiation beam; a projection system configured to project the patterned radiation beam onto a target portion of the substrate, a first holder to hold the patterning device on a first surface of the patterning device; and a second holder to hold the patterning device on a second surface of the patterning device, opposite to the first surface.

According to an embodiment of the invention, there is provided a device manufacturing method including imparting a pattern onto a patterned beam of radiation using a patterning device; projecting the patterned beam of radiation onto a substrate; holding the first patterning device on a first surface of the patterning device; and holding the patterning device on a second surface of the patterning device, different from the first surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
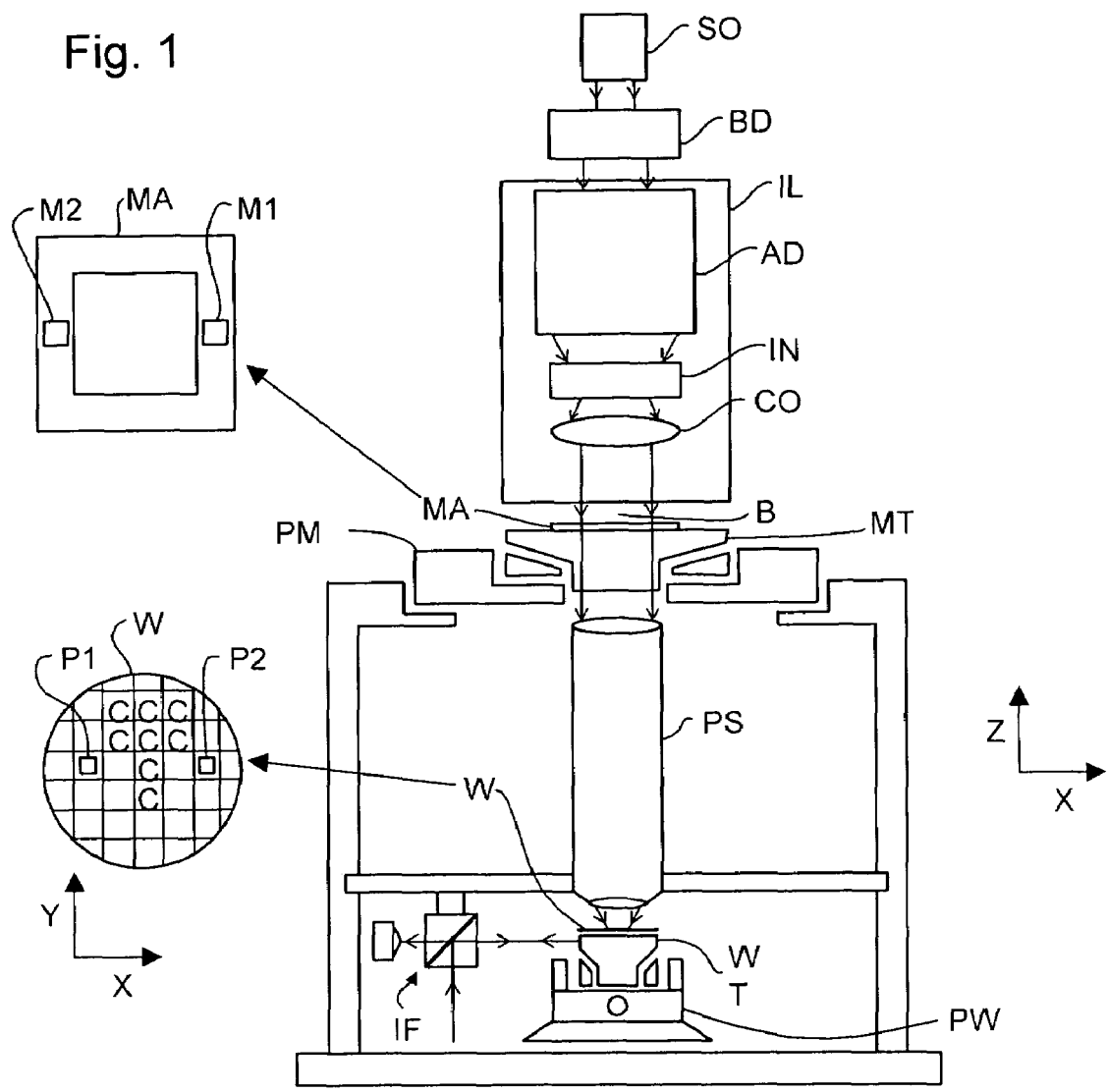
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
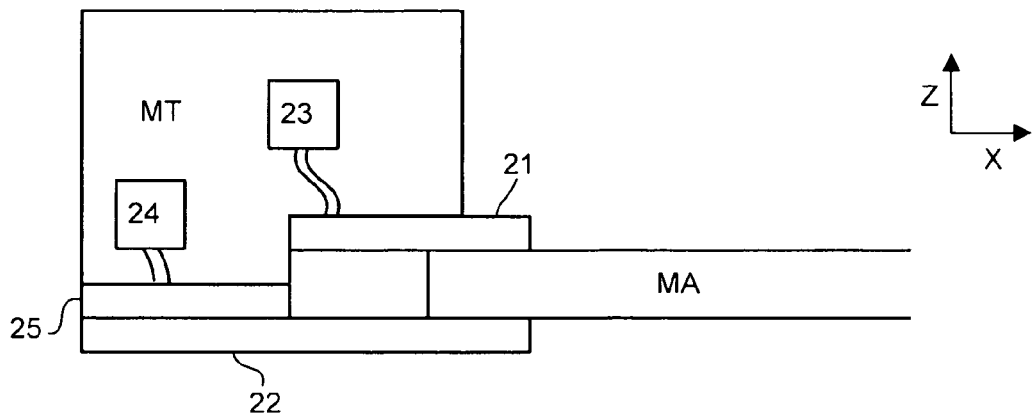
FIG. 2 depicts a patterning device clamped according to an embodiment of the invention.

As shown in FIG. 2 the mask MA can be clamped to the mask table MT on both surfaces of the mask. By clamping the mask MA on both surfaces, the mask can be subjected to large accelerations without slipping or deformation. In the embodiment of FIG. 2, the clamping, or holding force is preferably applied using thin membranes 21, 22 which further prevent deformation of the mask. The clamping force to the first surface of the mask MA is generated using a first vacuum clamp 23 or holder and the clamping force on the second surface of the mask is generated using a second vacuum clamp 24 or holder. The thin membranes are typically significantly thinner than mask MA. For example, the mask MA may be approximately 6 mm while the membrane is between about 0.2 mm and 0.4 mm. Preferably the thin membranes are stiff in the direction of acceleration of the mask MA (i.e. parallel to the plane of the mask MA) but more flexible in the direction perpendicular to the plane of the mask MA to avoid damaging the mask MA.

The first clamp 23 clamping the first surface of the mask MA supports the mask in directions parallel to the plane of the mask, perpendicular to the plane of the mask and also rotationally, i.e. it supports the mask rigidly. In contrast, the second clamp 24 supports the mask MA only in directions parallel to the plane of the mask to allow for variations in the thickness of mask MA.

Figure 3:
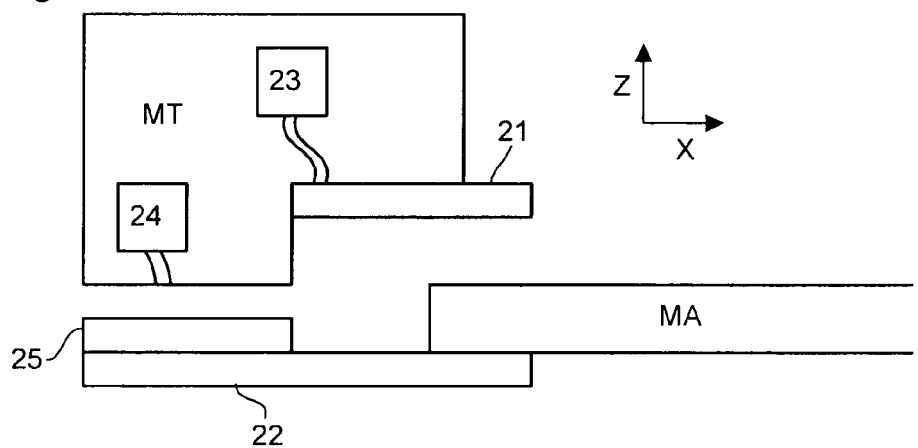
FIG. 3 depicts a lithographic apparatus according to an embodiment of the invention.
Figure 4:
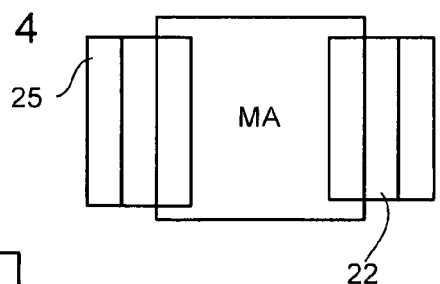
FIG. 4 depicts a plan view of a frame used with a mask table according to an embodiment of the invention.
Figure 5:
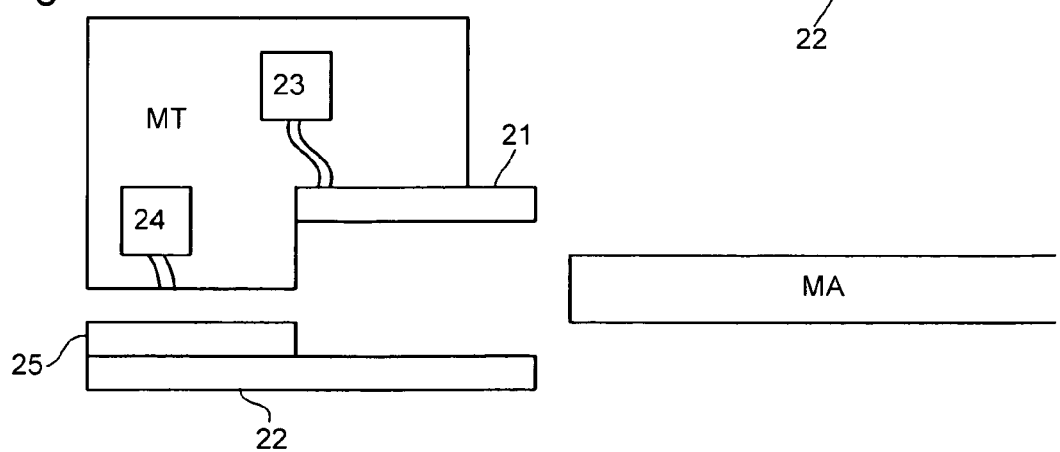
FIG. 5 depicts an alternative embodiment of the invention.

FIG. 3 depicts the mask being unloaded from the mask table. As can be seen in FIG. 4, thin membrane 22 forms part of a frame 25 which bears the mask. When a different mask is required the entire frame is removed and another frame, bearing a mask with a different pattern is inserted. Once inserted, the vacuum clamp is applied and the mask clamped into position. The frame 25 may or may not be connected to, and form part of the mask table MT. Alternatively, the mask MA may be removed and replaced separately from the frame 25, as shown in FIG. 5. In contrast to the second membrane, the first membrane 21 is rigidly connected to the mask table, for example by glue. In this example the mask MA is unloaded and loaded from the bottom of the mask table MT but the invention could equally be implemented by the first clamp 23 being below the mask MA (with the second clamp 24 (supporting the mask MA only in directions parallel to the mask MA) above the mask and the mask MA loaded and unloaded from above.

By clamping both sides of the mask MA (i.e. by the use of both thin membranes) the total frictional force has been significantly increased and it is thus possible to achieve larger accelerations without the introduction of damaging local forces. The increased acceleration in turn leads to a higher throughput.

To further improve the adhesion of the mask MA to the thin membranes, 21, 22 the thin membranes may be formed from a material with a high coefficient of friction, for example using rubber-like materials or the texture of the material.

The first clamp can be used to clamp the patterned surface of the mask MA or alternatively the non-patterned surface of the mask MA; in the latter instance the second clamp would clamp the patterned side of the mask MA.

There are preferably two first clamps 23 arranged on opposite sides, or edges, of the mask MA and two second clamps 24 arranged on opposite sides, or edges, of the mask MA.

Although described here in conjunction with vacuum clamps, the invention can also be implemented using other forms of clamp, for example electrostatic clamps.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support constructed to support a patterning device, the patterning device being capable of imparting the radiation beam with a pattern in its cross-section to form a patterned radiation beam;
   a projection system configured to project the patterned radiation beam onto a target portion of the substrate,
   a first holder to hold said patterning device on a first surface of said patterning device, the first surface being on a side of the patterning device comprising a patterning surface of the patterning device or the side opposite thereto; and
   a second holder to hold said patterning device on a second surface of said patterning device, opposite to said first surface, said second holder, in use, supporting said patterning device substantially only in directions parallel to the second surface of the patterning device.

2. A lithographic apparatus according to claim 1, wherein said first holder is a vacuum clamp.

3. A lithographic apparatus according to claim 1, wherein said second holder is a vacuum clamp.

4. A lithographic apparatus according to claim 1, wherein a thin membrane is used to apply a holding force to said first surface of said patterning device.

5. A lithographic apparatus according to claim 4, wherein said thin membrane has a high coefficient of friction.

6. A lithographic apparatus according to claim 4, wherein said thin membrane is movable relative to a pattering device holder.

7. A lithographic apparatus according to claim 1, wherein a second thin membrane is used to apply a holding force to said second surface of said patterning device.

8. A lithographic apparatus according to claim 7, wherein said second thin membrane has a high coefficient of friction.

9. A lithographic apparatus according to claim 7, wherein said second thin membrane is rigidly mounted to a patterning device holder.

10. A lithographic apparatus according to claim 9, wherein said patterning device holder is removable from said lithographic apparatus.

11. A lithographic apparatus according to claim 10, wherein said patterning device is rigidly mounted to said second thin membrane.

12. A lithographic apparatus according to claim 10, wherein said patterning device is detachable from said second thin membrane.

13. A lithographic apparatus according to claim 1, wherein said first holder, in use, supports said patterning device in directions parallel to the first surface of the patterning device, perpendicular to the first surface of the patterning device and rotationally.

14. A lithographic apparatus according to claim 1, further comprising another first holder and another second holder, each of said first and second holders being arranged on opposite sides of said substrate.

15. A device manufacturing method comprising:
    imparting a pattern onto a beam of radiation using a patterning device to form a patterned beam of radiation;
    projecting said patterned beam of radiation onto a substrate;
    holding said patterning device on a first surface of said patterning device, the first surface being on a side of the patterning device comprising a patterning surface of the patterning device or the side opposite thereto; and
    holding said patterning device on a second surface of said patterning device, opposite from said first surface, substantially only in directions parallel to the second surface of the patterning device.

16. A device manufacturing method according to claim 15, comprising holding said patterning device on the first surface using a vacuum clamp.

17. A device manufacturing method according to claim 15, comprising holding said patterning device on the second surface using a vacuum clamp.

18. A device manufacturing method according to claim 15, comprising holding said patterning device on the first surface of the patterning device in directions parallel to the first surface of the patterning device, perpendicular to the first surface of the patterning device and rotationally.

19. A device manufacturing method according to claim 15, comprising using a thin membrane to apply a holding force to the second surface of the patterning device, the thin membrane having a high coefficient of friction.

* * * * *

UNITED STATES PATENT AND TRADEMARK OFFICE
CERTIFICATE OF CORRECTION

PATENT NO. : 7,352,438 B2
APPLICATION NO. : 11/353232
DATED : April 1, 2008
INVENTOR(S) : Bernardus Antonius Johannes Luttikhuis et al.

It is certified that error appears in the above-identified patent and that said Letters Patent is hereby corrected as shown below:

On title page, Item (75) Inventors, Line 3
  replace "Loopsta,"
  with --Loopstra,--.

Signed and Sealed this
Fifth Day of February, 2013

Teresa Stanek Rea
*Acting Director of the United States Patent and Trademark Office*